(12) United States Patent
Xu (10) Patent No.: US 11,991,842 B2
(45) Date of Patent: May 21, 2024

(54) FRAME AND DISPLAY SCREEN (71) Applicant: Glux Visual Effects Tech (Shenzhen) Co., LTD, Guangdong (CN)

(72) Inventor: Yuancai Xu, Shenzhen (CN)

(73) Assignee: GLUX VISUAL EFFECTS TECH (SHENZHEN) CO., LTD, Guangdong (CN)

( * ) Notice: Subject to any disclaimer, the term of this patent is extended or adjusted under 35 U.S.C. 154(b) by 0 days.

(21) Appl. No.: 17/935,210

(22) Filed: Sep. 26, 2022

(65) Prior Publication Data

US 2023/0337377 A1 Oct. 19, 2023

(30) Foreign Application Priority Data

Apr. 13, 2022 (CN) .......................... 202210382383.8

(51) Int. Cl.
*H05K 5/02* (2006.01)
*H05K 5/00* (2006.01)

(52) U.S. Cl.
CPC ......... *H05K 5/0208* (2013.01); *H05K 5/0018* (2022.08)

(58) Field of Classification Search
None
See application file for complete search history.

(56) References Cited

U.S. PATENT DOCUMENTS

| | | | |
|---|---|---|---|
| 9,053,645 B2* | 6/2015 | Hellenthal | G09F 9/30 |
| 9,148,614 B2* | 9/2015 | Szolyga | H04N 5/64 |
| 10,342,150 B1* | 7/2019 | Davis | B60R 11/0264 |
| 10,429,892 B1* | 10/2019 | Mathew | G06F 1/1656 |
| 10,626,961 B2* | 4/2020 | Heo | G09F 9/3026 |
| 2009/0225506 A1* | 9/2009 | Lee | H05K 5/0021 29/469 |
| 2017/0357472 A1* | 12/2017 | Monsees | G09F 9/3026 |
| 2018/0035556 A1 | 2/2018 | Cass | |
| 2018/0157090 A1* | 6/2018 | Kim | G02F 1/133308 |
| 2019/0208655 A1* | 7/2019 | Schafer | G09F 9/3026 |
| 2019/0289729 A1* | 9/2019 | Nguyen | H05K 5/0017 |
| 2021/0378111 A1* | 12/2021 | Hao | G09F 9/33 |

FOREIGN PATENT DOCUMENTS

| | | |
|---|---|---|
| CN | 112951098 A | 6/2021 |
| WO | 2018068306 A1 | 4/2018 |

OTHER PUBLICATIONS

Extended European Search Report issued for European Patent Application No. 22200076.2, dated May 15, 2023, 11 pages.

* cited by examiner

*Primary Examiner* — Xanthia C Relford
(74) *Attorney, Agent, or Firm* — HSML P.C.

(57) ABSTRACT

The present disclosure relates to a frame and a display screen. The frame includes: a frame body made of a carbon fiber or glass fiber material, and an embedded member made of a metal or plastic material and connected to the frame body; the frame body and the embedded member are connected in a mold by compression molding, and the embedded member is configured to mount a lock body. Under the same volume requirement, the frame body has a smaller volume and a greater structural strength, and the lightweight design of the frame is implemented on a basis of the structural strength. At the same time, it is ensured that the embedded member can be processed to have a mounting structure matched with the lock body, and the mounting structure can satisfy higher processing efficiency and accuracy.

8 Claims, 6 Drawing Sheets

FRAME AND DISPLAY SCREEN

CROSS REFERENCE TO RELATED APPLICATION

The present disclosure is based on and claims priority to Chinese Patent Application with No. 202210382383.8 and filed on Apr. 13, 2022, the content of which is expressly incorporated herein by reference in its entirety.

TECHNICAL FIELD

The present disclosure relates to the field of display screen technology, and particularly to a frame and a display screen including the frame.

BACKGROUND

The Light Emitting Diode (LED) display screens are used for displaying various information such as texts, images and videos, etc. The LED display screen integrates the electronic technology, the computer technology and the information processing technology, and adopts a modular structure to control the display, and changes contents displayed on the screen such as texts, animations, pictures or videos by lighting or extinguishing the lamp beads. The LED display screen has advantages of bright in color, a wide dynamic range, a high brightness, a long service life, and a stable and reliable operation, etc., so that the LED display screen is widely used in the commercial media, the cultural performance market, the stadiums, the information dissemination, the news release and the securities trading, etc., accordingly requirements of different environments can be satisfied.

The LED display screen usually includes a frame and a lock body. The frame is configured to install a display unit displaying images. The frames can be spliced with each other; and two adjacent frames are fixedly connected to each other through the lock body. The conventional frame is usually made of the aluminum material, but the frame made of the aluminum material usually has disadvantages of greater weight and less structural strength.

SUMMARY

In view of this, the technical problem to be solved by the present disclosure is how to implement the lightweight design on a basis of the structural strength.

A frame is provided, including:
a frame body made of a carbon fiber or glass fiber material; and
an embedded member made of a metal or plastic material and connected to the frame body, wherein the frame body and the embedded member are connected in a mold by compression molding, and the embedded member is configured to mount a lock body.

In an embodiment, the frame body is provided with a mounting hole, and the embedded member is matched with the mounting hole to be embedded in the frame body.

In an embodiment, the mounting hole includes an intermediate cavity, a first hole and a second hole, the first hole and the second hole are located on two opposite sides of the intermediate cavity; the embedded member includes a carrier, a first boss and a second boss, both of the first boss and the second boss are respectively arranged on and protruding from two surfaces of the carrier in a direction of a thickness of the carrier, the carrier is matched with the intermediate cavity, the first boss is matched with the first hole, and the second boss is matched with the second hole.

In an embodiment, the frame body is configured to have a first side frame, a second side frame, a front panel, and a back panel; the first side frame is arranged to surround the second side frame, the front panel is connected to one end of the first side frame and one end of the second side frame, and the back panel is connected to the other end of the first side frame and the other end of the second side frame; the first side frame, the second side frame, the front panel and the back panel together enclose the intermediate cavity, the first hole is provided on the first side frame, and the second hole is provided on the second side frame.

In an embodiment, the thickness of the carrier body and a width of the intermediate cavity are reduced in a direction from the front panel to the back panel.

In an embodiment, the two surfaces of the carrier configured to connect the first boss and the second boss are sandwiched within the frame body, and the two surfaces are each provided with a concave-convex structure.

In an embodiment, the frame further includes a connector which is fixedly connected to two adjacent embedded members.

In an embodiment, the frame body includes two longitudinal segments and two transverse segments, the two transverse segments are spaced apart from each other, wherein one longitudinal segment is connected between one end of one transverse segment and one end of the other transverse segment, and the other longitudinal segment is connected between the other end of the one transverse segment and the other end of the other transverse segment, each longitudinal segment and each transverse segment are provided with at least one embedded member.

In an embodiment, the frame body further includes a first reinforcement beam and a second reinforcement beam which are cross-connected with each other, both ends of the first reinforcement beam are respectively connected to the two transverse segments, both ends of the second reinforcement beam are respectively connected to the two longitudinal segments.

A display screen is provided, including a lock body, a display unit and the frame of claim 1, wherein the display unit is provided within the frame body, and the lock body is connected to two adjacent embedded members on the frame body.

A technical effect of an embodiment of the present disclosure is provided as follows. On the one hand, the frame body is made of the carbon fiber or glass fiber material, so that the frame body has a smaller volume and a greater structural strength under the same volume requirement, and the lightweight design of the frame is implemented on the basis of the structural strength. On the other hand, the embedded member made of the metal or plastic material has well machining property, which ensures that the embedded member can be processed to have a mounting structure that matches the lock body, and the mounting structure satisfies higher processing efficiency and accuracy, thereby ensuring that the mounting structure can be applied to mount a lock body of a frame made of the aluminum alloy material. In other words, the lock body that can be mounted on the frame made of the aluminum alloy material can also be mounted on the frame, so that the frame can use the same lock body as the frame made of the aluminum alloy material to implement the same splicing mode, thereby ensuring that the splicing mode of the frame is the same as that of the frame made of the aluminum alloy material.

DETAILED DESCRIPTION

In order to facilitate understanding of the present disclosure, the present disclosure will be described more comprehensively hereinafter with reference to the related accompanying drawings. The preferred embodiments of the present disclosure are shown in the accompanying drawings. However, the present disclosure can be implemented in many different forms and is not limited to the embodiments described herein. Rather, these embodiments are provided to make the understanding of the present disclosure more comprehensive and thorough.

It should be noted that when a member is referred to as being "fixed to" another member, it can be directly provided on the other member or there may exist an intermediate member. When a member is referred to as being "connected" to another member, it can be directly connected to the other member or there may exist an intermediate member. The terms "inner", "outer", "left", "right" and similar expressions used herein are for the purpose of illustration only and do not represent the only embodiments.

Figure 1:
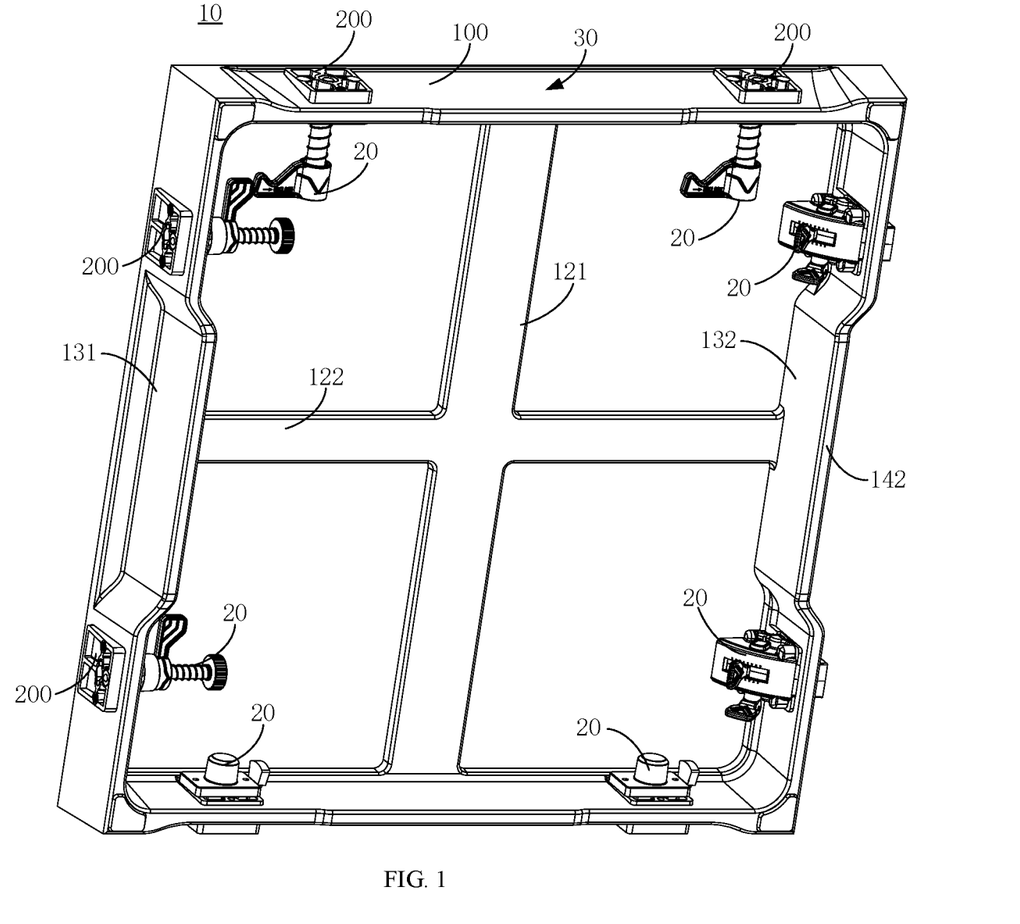
FIG. 1 is a schematic three-dimensional structure diagram of a display screen after removing a display unit according to an embodiment of the present disclosure.
Figure 2:
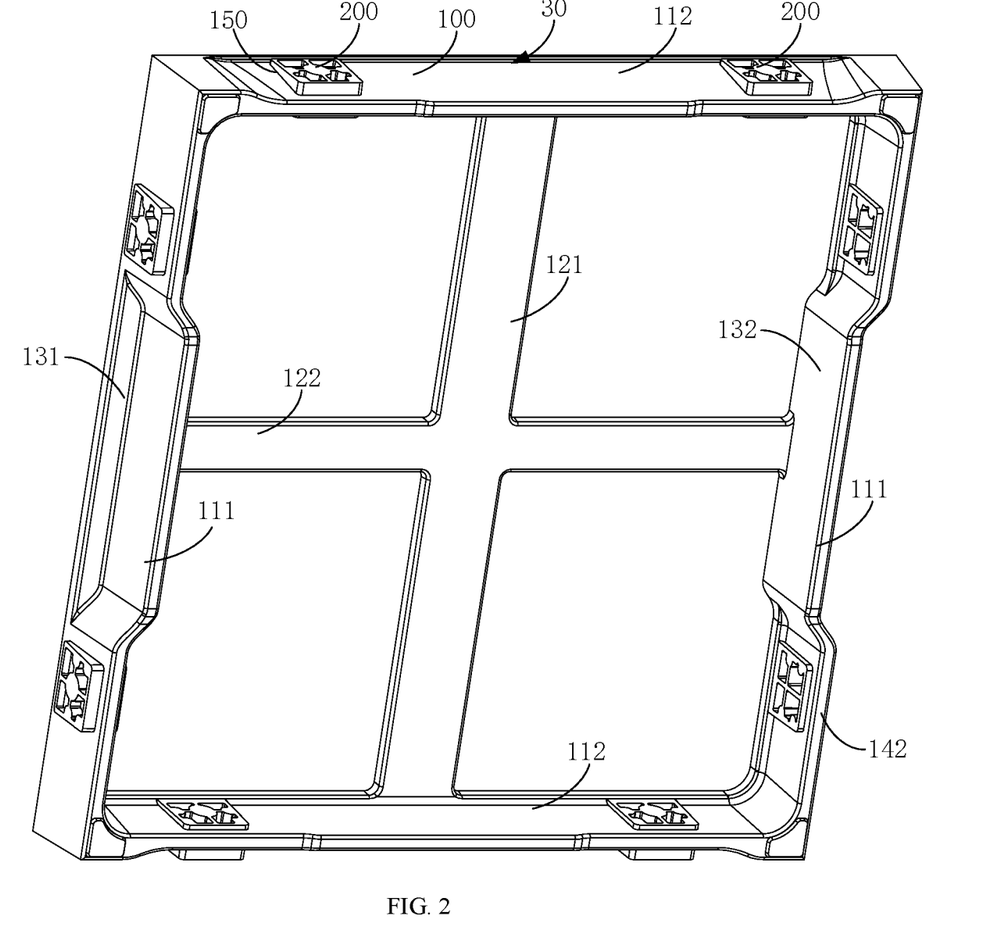
FIG. 2 is a schematic three-dimensional structure diagram of a frame in a display screen according to an embodiment of the present disclosure.
Figure 3:
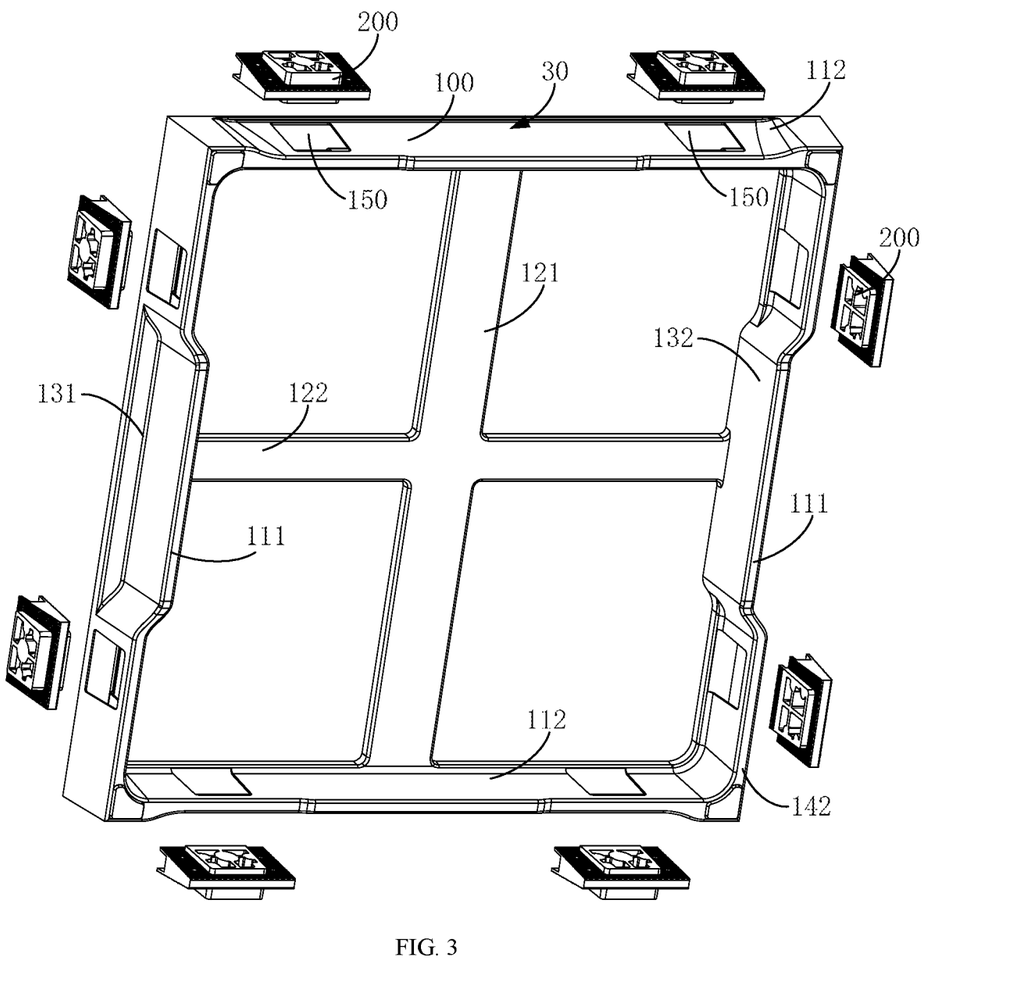
FIG. 3 is a schematic exploded structure diagram of the frame shown in FIG. 2 according to an example I.

Referring to FIG. 1, FIG. 2 and FIG. 3, a display screen 10 provided by an embodiment of the present disclosure includes a lock body 20, a display unit and a frame 30. The display unit is configured to emit light to display an image. The display unit is received in a cavity enclosed by the frame 30. The frame 30 serves as a carrier of the display unit and plays a certain protective role for the display unit. The display screen 10 may include one frame 30 or a plurality of frames 30. When a plurality of frames 30 is included, the plurality of frames 30 are spliced with each other through lock bodies 20. Since a display unit is provided in each frame 30, the larger the number of frames 30 to be spliced, the larger the display area of the display screen 10. Therefore, according to the requirements for implementing the size of the display area, different numbers of frames 30 can be utilized to splice each other to form the display screen 10 with different display area. The frame 30 includes a frame body 100 and an embedded member 200; the embedded member 200 and the frame 30 are connected to each other.

Figure 7:
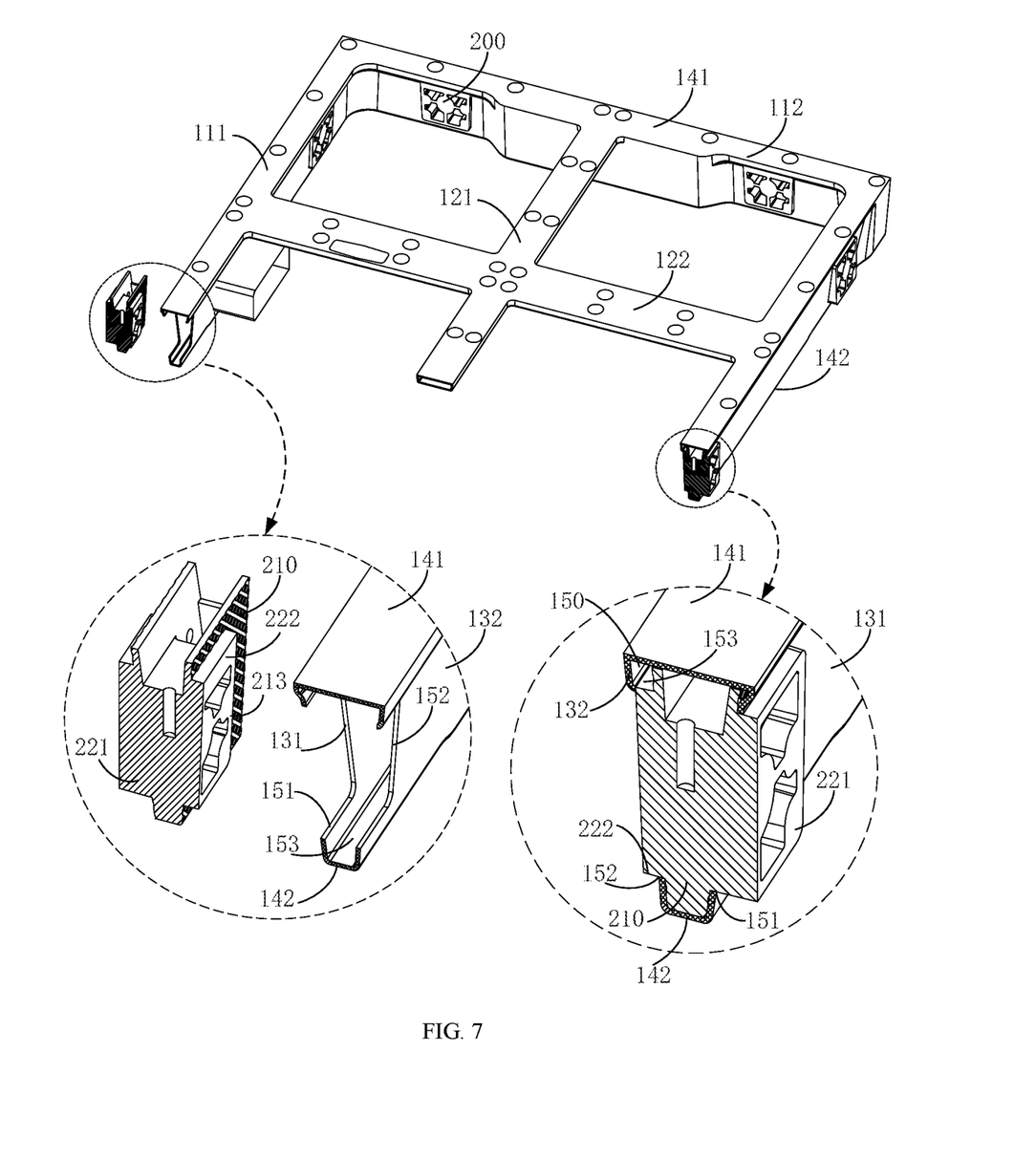
FIG. 7 is a schematic diagram of a three-dimensional exploded structure of the frame shown in FIG. 2.

Referring to FIGS. 2, 3 and 7, in some embodiments, the frame body 100 may be substantially rectangular; and the frame body 100 includes a longitudinal segment 111 and a transverse segment 112; the number of the longitudinal segments 111 is two, and the two longitudinal segments 111 are substantially parallel to each other and spaced from each other. The number of the transverse segments 112 is two; and the two transverse segments 112 are also substantially parallel to each other and spaced from each other. One of the longitudinal segments 111 is connected between one end of one transverse segment 112 and one end of the other transverse segment 112; and the other longitudinal segment 111 is connected between the other end of the one transverse segment 112 and the other end of the other transverse segment 112. Each longitudinal segment 111 may be provided with at least one embedded member 200 and one mounting hole 150, for example, each longitudinal segment 111 may be provided with two embedded members 200 and two mounting holes 150; and the two embedded members 200 are respectively mounted in the two mounting holes 150; the two embedded members 200 are arranged at intervals along an extension direction of the longitudinal segment 111. Each transverse segment 112 may be provided with at least one embedded member 200 and one mounting hole 150, for example, each transverse segment 112 may be provided with two embedded members 200 and two mounting holes 150; and the two embedded members 200 are respectively mounted in the two mounting holes 150; the two embedded members 200 are arranged at intervals along an extension direction of the transverse segment 112. In other embodiments, the frame body 100 may also have a regular polygon shape, a circular shape, or an ellipse shape, and so on.

In some embodiments, the frame body 100 further includes a first reinforcement beam 121 and a second reinforcement beam 122. The first reinforcement beam 121 and the second reinforcement beam 122 can intersect with each other, and can be connected and perpendicular to each other. The first reinforcement beam 121 is located between two longitudinal segments 111, such that the first reinforcement beam 121 and the two longitudinal segments 111 are spaced apart; and both ends of the first reinforcement beam 121 are fixedly connected to the two transverse segments 112 respectively. The second reinforcement beam 122 is located between the two transverse segments 112, such that the second reinforcement beam 122 and the two transverse segments 112 are spaced apart; and both ends of the second reinforcement beam 122 are fixedly connected to the two longitudinal segments 111 respectively. By arranging the first reinforcement beam 121 and the second reinforcement beam 122, the structural strengths of the frame body 100 and the frame 30 can be reasonably enhanced.

In some embodiments, the frame body 100 is configured to have a first side frame 131, a second side frame 132, a front panel 141 and a back panel 142; the first side frame 131 is arranged around the second side frame 132, and the front panel 141 is connected to one end of the first side frame 131 and one end of the second side frame 132; the back panel 142 is connected to the other end of the first side frame 131 and the other end of the second side frame 132; the front panel 141 and the back panel 142 face opposite directions; and the front panel 141 faces the same direction as a light emission direction of the display unit, so that the back panel 142 faces a direction opposite to the light emission direction of the display unit. Obviously, the transverse segment 112 consists of one portion of the first side frame 131, one portion of the second side frame 132, one portion of the front panel 141 and one portion of the back panel 142; and the longitudinal segment 111 consists of the other portion of the first side frame 131, the other portion of the second side frame 132, the other portion of the front panel 141 and the other portion of the back panel 142.

The frame body 100 is provided with a mounting hole 150; and the mounting hole 150 matches the embedded member 200, that is, the mounting hole 150 is configured to mount the embedded member 200, so that the embedded member 200 is embedded in the frame body 100. The mounting hole 150 includes an intermediate cavity 153, a first hole 151 and a second hole 152; the first hole 151 and the second hole 152 are located on opposite sides of the intermediate cavity 153. Specifically, the intermediate cavity 153 is jointly surrounded by the first side frame 131, the second side frame 132, the front panel 141 and the back panel 142; the first hole 151 is provided on the first side frame 131, and the first hole 151 passes through the entire first side frame 131 to communicate with the outside world and the intermediate cavity 153. The second hole 152 is provided on the second side frame 132; and the second hole 152 passes through the entire second side frame 132 to communicate with the outside world and the intermediate cavity 153. Apertures of the first hole 151 and the second hole 152 may be substantially the same; and both the first hole 151 and the second hole 152 may be substantially rectangular.

Figure 5:
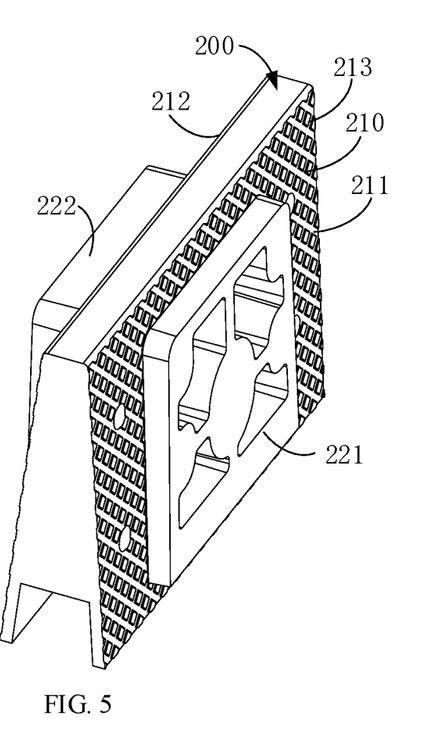
FIG. 5 is a schematic three-dimensional structure diagram of an embedded member in the frame shown in FIG. 2.
Figure 6:
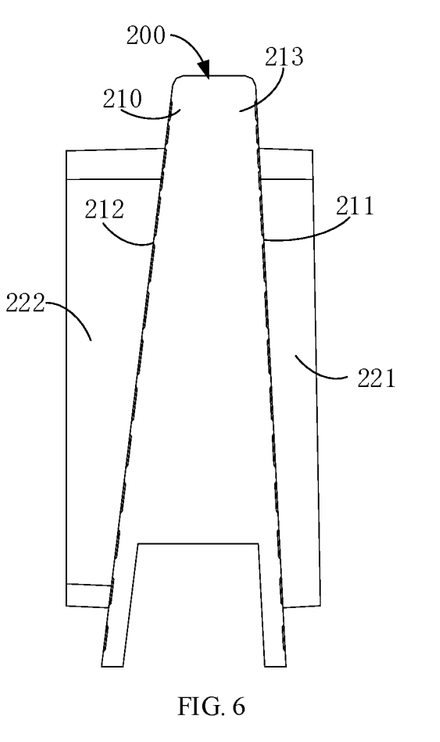
FIG. 6 is a schematic planar structure diagram of the embedded member shown in FIG. 5.

Referring to FIGS. 5, 6 and 7, in some embodiments, the embedded member 200 includes a carrier 210, a first boss 221 and a second boss 222. The carrier 210 has a substantially plate-type structure. The carrier 210 has a first surface 211 and a second surface 212. The first surface 211 and the second surface 212 are spaced apart in a direction of a thickness of the carrier 210 and face opposite directions. The first boss 221 is fixed on the first surface 211, and the first boss 221 protrudes from the first surface 211 to a certain height in the direction of the thickness of the carrier 210. In other words, the first boss 221 is provided on and protruding from the first surface 211. The second boss 222 is fixed on the second surface 212, and the second boss 222 protrudes from the second surface 212 to a certain height in the direction of the thickness of the carrier 210. In other words, the second boss 222 is provided on and protruding from the second surface 212.

For the mounting of the embedded member 200, the carrier 210 is matched with the intermediate cavity 153; and in a direction from the front panel 141 to the back panel 142, the thickness of the carrier 210 gradually decreases, and the width of the intermediate cavity 153 also decreases, such that the carrier 210 is sandwiched in the intermediate cavity 153. Specifically, the first surface 211 of the carrier 210 can be stacked on the first side frame 131, and the second surface 212 of the carrier 210 can be stacked on the second side frame 132. The first boss 221 is matched with the first hole 151, and the second boss 222 is matched with the second hole 152.

In some embodiments, both the first surface 211 and the second surface 212 of the carrier 210 are provided with concave-convex structures 213. The concave-convex structure 213 on the first surface 211 can be in contact with the first side frame 131. By the action of the concave-convex structure, an engagement structure can be formed between the carrier 210 and the first side frame 131, thereby improving a binding force between the carrier 210 and the first side frame 131. The concave-convex structure 213 on the second surface 212 can be in contact with the second side frame 132. By the action of the concave-convex structure 213, an engagement structure can be formed between the carrier 210 and the second side frame 132, thereby improving the binding force between the carrier 210 and the second side frame 132. Therefore, by providing the concave-convex structures 213 on the first surface 211 and the second surface 212, the connection force between the entire embedded member 200 and the frame body 100 can be improved.

Figure 4:
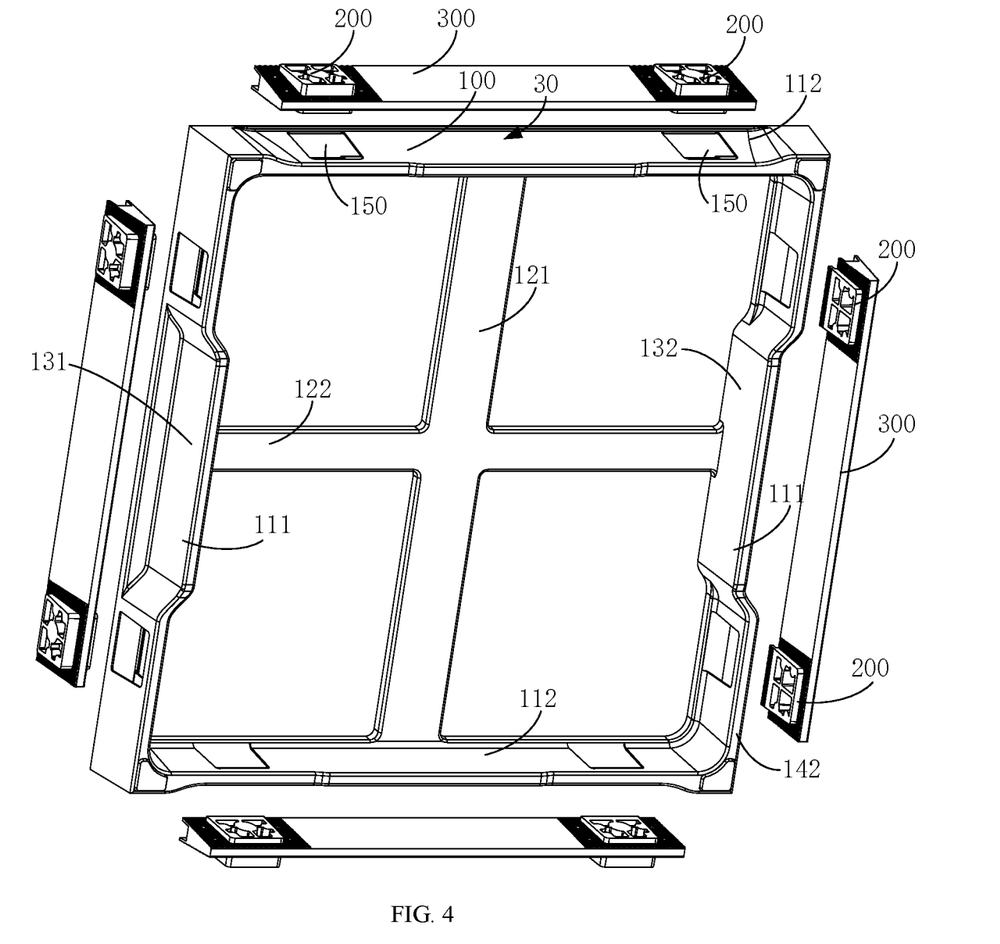
FIG. 4 is a schematic exploded structure diagram of the frame shown in FIG. 2 according to an example II.

In some embodiments, for example, referring to FIG. 3, each embedded member 200 can be independently provided on the frame body 100. For another example, referring to FIG. 4, the frame 30 may further include a connector 300; and the connector 300 may have a substantially plate-type structure. The connector 300 is fixedly connected between two adjacent embedded members 200, such that the two embedded members 200 are associated through the connector 300, that is, the two embedded members 200 are not independent, so that the two embedded members 200 can only be simultaneously mounted on the frame body 100. By providing the connector 300, the assembly efficiency of the embedded member 200 and the structural strength of the entire frame 30 can be improved to a certain extent. Specifically, two embedded members 200, when provided on the transverse segment 112 of the frame body 100, can be fixedly connected through the connector 300. Two embedded members 200, when provided on the longitudinal segment 111 of the frame body 100, can also be fixedly connected by the connector 300. Of course, for two adjacent embedded members 200 provided on the transverse segment 112 and the longitudinal segment 111, the two adjacent embedded members 200 can also be fixedly connected through the connector 300.

The embedded member 200 is configured to mount the lock body 20. For the splicing of two adjacent frames 30, the lock body 20 simultaneously connects the embedded members 200 on the two adjacent frames 30, thereby implementing the splicing between the frames 30. The two transverse segments 112 of the frame 30 are spaced apart in an up-down direction. The embedded members 200 on the transverse segment 112 implement the splicing between the frames 30 in the up-down direction through the lock body 20. The two longitudinal segments 111 of the frame 30 are spaced apart in a left-right direction; and the embedded members 200 on the longitudinal segment 111 implement the splicing between the frames 30 in the left-right direction through the lock body 20. The lock body 20 can change a mounting angle, accordingly a splicing angle between the left and right frames 30 can be adjusted, so that the spliced display screen 10 can have a flat surface or a curved surface. The curved surface includes a convex arc surface, a concave arc surface or a wave shape face and so on. Since the splicing angle between the frames 30 can be adjusted, the shape of the display screen 10 can be made more diverse, so that the display screen 10 can be applied to more installation environments.

The frame body 100 is made of a carbon fiber or glass fiber material; and the embedded member 200 is made of a metal or plastic material, such that the machining property of the embedded member 200 is better than that of the frame body 100. In other words, during the machining, the embedded member 200 has a higher processing efficiency and a processing accuracy relative to the frame body 100.

The manufacture of the entire frame 30 may include the following steps. At the first step, an embedded member 200 and a plurality of laminate bodies made of the carbon fiber or glass fiber material are provided; each laminate body is provided with a hole structure; the laminate bodies form an intermediate blank in a mold through stacking, bending and wrapping. Of course, in the process of forming the intermediate blank in the mold, the embedded member 200 is embedded in the intermediate blank, and the embedded member 200 is matched with the hole structure in the laminate body; and the hole structure in the laminate body forms a part of the formed mounting hole 150. At the second step, a pressure is applied to the intermediate blank in the mold, such that the intermediate blank is compression-molded to form the frame body 100 under the action of pressure. In the process that the intermediate blank is compression-molded, a bonding force is generated between the embedded member 200 and the intermediate blank, and after the intermediate blank is finally transformed into the frame body 100, a stable and reliable connection relationship is formed between the embedded member 200 and the frame body 100. Since both the first surface 211 and the second surface 212 of the embedded member 200 are provided with the concave-convex structures 213, during the compression molding process of the intermediate blank, an engagement relationship is formed between the embedded member 200 and the intermediate blank under the action of pressure, which finally causes an engagement structure between the embedded member 200 and the molded frame body 100, thereby improving the connection strength between the embedded member 200 and the frame body 100. At the third step, the embedded member 200 is machined by a Computer Number Control (CNC) technology to ensure that the embedded member 200 can quickly process the mounting structure for mounting the lock body 20, and to ensure that the mounting structure has a reasonable shape and a dimensional accuracy, thereby improving the processing efficient and accuracy of the mounting structure, so that the embedded member 200 can satisfy the mounting requirements of the lock body 20.

If the entire frame 30 is made of an aluminum alloy material, under the condition that the volume is kept constant, the weight of the frame 30 made of the aluminum alloy material is larger while the structural strength is lower. Therefore, in order to ensure the structural strength, the frame 30 made of the aluminum alloy material definitely has a sufficient volume, accordingly the weight of the frame 30 made of the aluminum alloy material is increased, which is not conducive to the lightweight design of the frame 30. For example, the volume of the frame 30 is reduced in order to satisfy the lightweight design of the frame 30, so that the structural strength of the frame 30 made of the aluminum alloy material cannot satisfy the actual requirements, as a result the frame 30 made of the aluminum alloy material cannot be of the lightweight design and the high strength design of products.

If the entire frame 30 is made of a composite material such as carbon fiber or glass fiber and is compression-molded, compared to the frame 30 made of the aluminum alloy materials, the frame 30 made of the composite material has less weight and higher structural strength at the same volume, so that the frame 30 completely made of the composite material can satisfy the lightweight design and high strength design of the products. However, as for the frame 30 completely made of the composite material and compression-molded, in the subsequent machining by the CNC technology to form the mounting structure for mounting the lock body 20, the processing efficiency and processing accuracy of the frame 30 satisfy the design requirements, so that the mounting structure formed on the frame 30 cannot be configured to mount a lock body 20 applied to the frame 30 made of the aluminum alloy material. In other words, in view of the insufficient processing accuracy of the frame 30 completely made of the composite material, the lock body 20 that can be mounted on the frame 30 made of the aluminum alloy material cannot be mounted on the frame 30 made of the composite material, so that the frame 30 made of the composite material cannot use the same lock body 20 as the frame 30 made of the aluminum alloy material to implement the same splicing mode, resulting in that the splicing mode of the frame 30 made of the composite material is different from the splicing mode of the frame 30 made of the aluminum alloy material. At the same time, since the embedded member 200 has the mounting structure for mounting the lock body 20, the mounting structure is relatively complicated. If the mounting structure is not formed by machining, the mounting structure is definitely formed by compression molding. However, it is usually difficult to form the mounting structure at one time by compression molding in a mold. Even if the mounting structure can be formed by compression molding, the design and processing costs of the mold are greatly increased, thereby increasing the manufacturing cost of the entire frame 30.

As for the frame 30 in the above-mentioned embodiment, on the one hand, the frame body 100 is made of the carbon fiber or glass fiber material, under the same volume, the frame body 100 has a smaller volume and a greater structural strength, so that the lightweight and high strength designs of the whole frame 30 can be simultaneously implemented. On the other hand, the embedded member 200 made of the metal or plastic material has well machinability, which ensures that the embedded member 200 can be machined to have a mounting structure matching the lock body 20, and the mounting structure satisfies the higher processing efficiency and accuracy, so that the mounting structure can be applied to mount the lock body 20 of the frame 30 made of the aluminum alloy material. In other words, for the lock body 20 that can be mounted on the frame 30 made of the aluminum alloy material, the lock body 20 can also be mounted on the frame 30, so that the frame 30 made of the composite material can use the same lock body 20 as the frame 30 made of the aluminum alloy material to implement the same splicing mode, accordingly it is guaranteed that the splicing mode of the frame 30 made of the composite material is the same as the splicing mode of the frame 30 made of the aluminum alloy material.

Therefore, by the frame 30 in the above-mentioned embodiment, the lightweight and high strength designs can be implemented, and meanwhile the frame 30 made of the composite material can achieve the same splicing mode as the frame 30 made of the aluminum alloy material through the same lock body 20. In other words, the splicing mode of the frame 30 made of the aluminum alloy material can be directly applied to the frame 30 made of the composite material to ensure that the user can also use the frame 30 made of the composite material without changing the existing splicing mode.

The technical features of the above-described embodiments can be combined arbitrarily. For the sake of brevity, all possible combinations of the technical features in the above-described embodiments are not described. However, as long as there is no contradiction between the combinations of these technical features, all should be regarded as the scope described in the present disclosure.

The above-mentioned embodiments are merely some embodiments of the present disclosure, and the descriptions thereof are specific and detailed, but should not be construed as a limitation to the scope of the disclosure. It should be pointed out that those of ordinary skill in the art can make several modifications and improvements without departing from the concept of the present disclosure, which all fall within the protection scope of the present disclosure. Therefore, the protection scope of the present disclosure shall be subject to the appended claims.

What is claimed is:

1. A frame, comprising:
a frame body made of a carbon fiber or glass fiber material; and
an embedded member made of a metal or plastic material and connected to the frame body, wherein the frame body and the embedded member are connected in a mold by compression molding, and the embedded member is configured to mount a lock body,
wherein the frame body is provided with a mounting hole, and the embedded member is matched with the mounting hole to be embedded in the frame body;
wherein the mounting hole comprises an intermediate cavity, a first hole and a second hole, the first hole and the second hole are located on two opposite sides of the intermediate cavity; the embedded member comprises a carrier, a first boss and a second boss, both of the first boss and the second boss are respectively arranged on and protruding from two surfaces of the carrier in a direction of a thickness of the carrier, the carrier is matched with the intermediate cavity, the first boss is matched with the first hole, and the second boss is matched with the second hole.

2. The frame according to claim 1, wherein the frame body is configured to have a first side frame, a second side frame, a front panel, and a back panel; the first side frame is arranged to surround the second side frame, the front panel is connected to one end of the first side frame and one end of the second side frame, and the back panel is connected to the other end of the first side frame and the other end of the second side frame; the first side frame, the second side frame, the front panel and the back panel together enclose the intermediate cavity, the first hole is provided on the first side frame, and the second hole is provided on the second side frame.

3. The frame according to claim 2, wherein the thickness of the carrier body and a width of the intermediate cavity are reduced in a direction from the front panel to the back panel.

4. The frame according to claim 1, wherein the two surfaces of the carrier configured to connect the first boss and the second boss are sandwiched within the frame body, and the two surfaces are each provided with a concave-convex structure.

5. A display screen, comprising a lock body, a display unit, and the frame of claim 1, wherein the display unit is provided within the frame body, and the lock body is connected to two adjacent embedded members on the frame body.

6. A frame, comprising:
a frame body made of a carbon fiber or glass fiber material;
an embedded member made of a metal or plastic material and connected to the frame body, wherein the frame body and the embedded member are connected in a mold by compression molding, and the embedded member is configured to mount a lock body; and
a connector which is fixedly connected to two adjacent embedded members.

7. A frame, comprising:
a frame body made of a carbon fiber or glass fiber material; and
an embedded member made of a metal or plastic material and connected to the frame body, wherein the frame body and the embedded member are connected in a mold by compression molding, and the embedded member is configured to mount a lock body,
wherein the frame body comprises two longitudinal segments and two transverse segments, the two transverse segments are spaced apart from each other, wherein one longitudinal segment is connected between one end of one transverse segment and one end of the other transverse segment, and the other longitudinal segment is connected between the other end of the one transverse segment and the other end of the other transverse segment, each longitudinal segment and each transverse segment are provided with at least one embedded member.

8. The frame according to claim 7, wherein the frame body further comprises a first reinforcement beam and a second reinforcement beam which are cross-connected with each other, both ends of the first reinforcement beam are respectively connected to the two transverse segments, both ends of the second reinforcement beam are respectively connected to the two longitudinal segments.

* * * * *